United States Patent [19]

Guerin et al.

[11] Patent Number: 4,780,626
[45] Date of Patent: Oct. 25, 1988

[54] DOMINO-TYPE MOS LOGIC GATE HAVING AN MOS SUB-NETWORK

[75] Inventors: Armand Guerin, Clamart; Michel J. Lanfranca, Paris, both of France

[73] Assignee: U.S. Philips Corporation, New York, N.Y.

[21] Appl. No.: 31,727

[22] Filed: Mar. 26, 1987

[30] Foreign Application Priority Data

Mar. 28, 1986 [FR] France ................... 86 04504

[51] Int. Cl.⁴ ................ H03K 19/096; H03K 19/003
[52] U.S. Cl. ..................................... 307/448; 307/452; 307/453
[58] Field of Search ............... 307/443, 448, 451–453, 307/571, 576, 579, 585, 241, 481; 377/68, 74, 79

[56] References Cited

U.S. PATENT DOCUMENTS

| | | | |
|---|---|---|---|
| 3,517,210 | 6/1970 | Rubinstein | 307/453 X |
| 3,573,487 | 4/1971 | Polkinghorn | 307/453 |
| 3,953,743 | 4/1976 | Hollingsworth | 307/448 |
| 3,982,138 | 9/1976 | Luisi et al. | 307/452 X |
| 4,107,548 | 8/1978 | Sakaba et al. | 307/453 X |
| 4,430,583 | 2/1984 | Shoji | 307/448 |
| 4,558,236 | 12/1985 | Burrows | 307/448 X |

FOREIGN PATENT DOCUMENTS

| | | | |
|---|---|---|---|
| 0068146 | 6/1979 | Japan | 307/448 |
| 0215131 | 12/1983 | Japan | 307/448 |
| 0235526 | 11/1985 | Japan | 307/448 |

*Primary Examiner*—Stanley D. Miller
*Assistant Examiner*—David R. Bertelson
*Attorney, Agent, or Firm*—Thomas A. Briody; Algy Tamoshunas; Steven R. Biren

[57] ABSTRACT

The invention relates to a logic MOS gate of the domino type, having a precharging transistor, a validation transistor and logic transistors. To prevent unwanted discharging of a precharged high level, which may be induced by at least one input data being stabilized too slowly, that is to say not before a clock signal has risen to the high level, a p-MOS sub-network is arranged in parallel with the source-drain path of the precharging transistor and receives at least the input data which was too slowly stabilized in such a manner as to establish a conductor path which reestablishes the precharged high level.

3 Claims, 2 Drawing Sheets

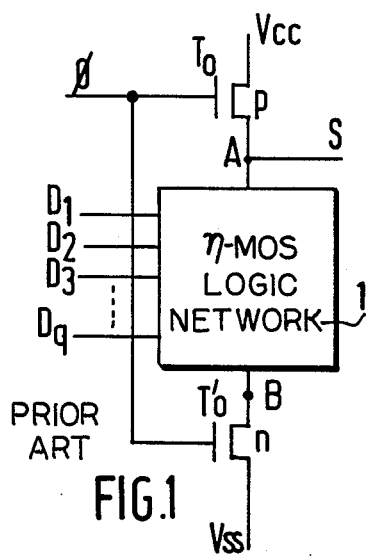
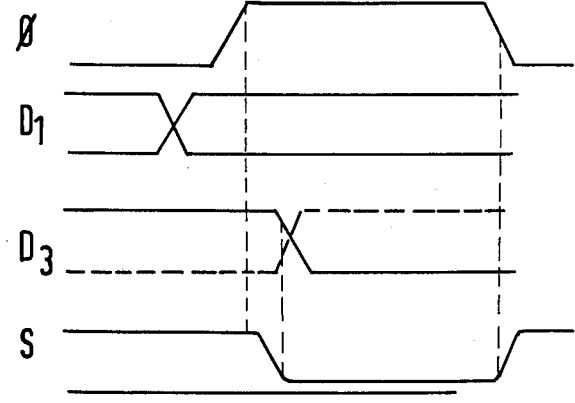
FIG.2
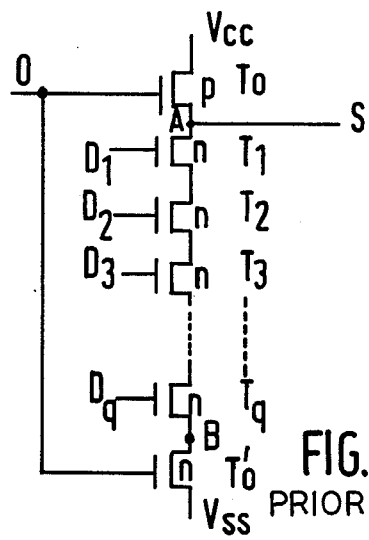
FIG.3 PRIOR ART
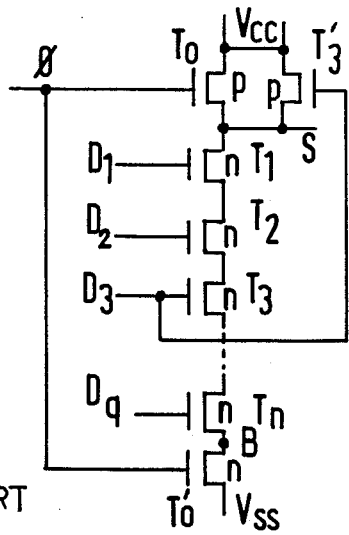
FIG.4
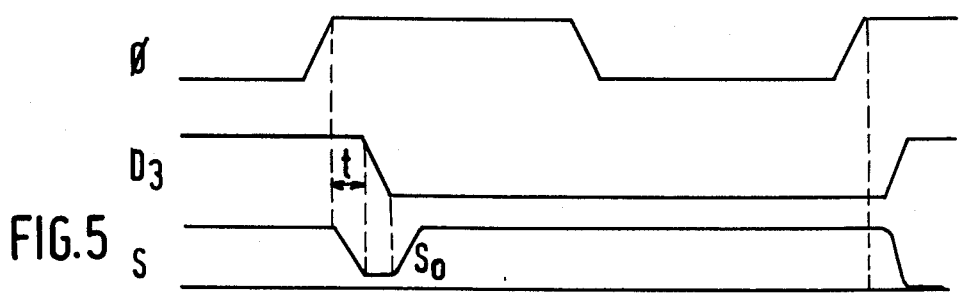
FIG.5

DOMINO-TYPE MOS LOGIC GATE HAVING AN MOS SUB-NETWORK

BACKGROUND OF THE INVENTION

The present invention relates to a domino-type MOS logic gate including a logic network comprising MOS transistors of a first conductivity type receiving input data and being connected between a first and a second voltage source via a source-drain path of a MOS precharging transistor of a second conductivity type, and a MOS validation transistor of the first conductivity type, respectively, a control electrode of the precharging and of the validation transistor receiving both a clock signal which, when it is at a first logic level, precharges at a precharging level an output of the logic gate and when it is at a second logic level allows reading of a logic output signal at the output.

In U.S. Pat. No. 3,551,693 the clock signal is used to provide a precharging of the output of the logic gate. Actually, when the clock signal is at a low level, said precharging transistor, which in the prior art is of the p-MOS type, is conductive and said validation transistor, which in the prior art is of the n-MOS type, is non-conductive, which causes the output of the logic gate to be precharged to the high level. When the clock signal is at the high level, the n-MOS validation transistor is conductive and the p-MOS precharging transistor is non-conductive. In that case, when the logic network is in a conductive state, the output of the logic gate changes state to the low level, while it remains at the high level when the logic network is not in a conductive state. The correct operation of the logic MOS gate implies that the data are stabilized at each clock pulse before the clock signal rises to the high level. Actually, when the changing of state of a data is effected with a delay and when this has for its consequence that the logic network is maintained incorrectly in a conducting state during a certain period of time, the effect of precharging the output to the high state may be completely or partly lost, and the output of the logic gate may remain at the low level when the logic network has become non-conductive.

SUMMARY OF THE INVENTION

The present invention has for its object to provide a logic gate of the type defined above, the output of which is protected from these faults in case a well-defined input or certain well-defined inputs are not stabilized until after the transition in the clock signal which, of the cited case, consists in a rise to a high level of the clock signal, and which allows reading of a logic output signal.

To that end, the logic gate according to the invention is characterized in that, in order to prevent an unwanted discharging of the precharging level in response to at least one input data being stabilized tardily, that is to say not before the clock signal has changed to a second logic level, it includes arranged parallel to a source-drain path of the precharging transistor a MOS subnetwork of the second conductivity type comprising the logic complement of at least one transistor of the logic network said at least one transistor receiving said tardily stabilized input data, the sub-network receiving at least said tardily stabilized input data and sub-network having fewer transistors than the logic network.

In a form of a domino-gate according to the invention, the logic network includes an AND-gate having a number of q inputs and comprises for that a number of q transistors, with their respective source-drain-paths connected in series between the precharging transistor and the validation transistor, whereby in case a number of x input data stabilized tardily, the sub-network comprises a number of a transistors arranged in parallel with the precharging transistor, each of said x transistors receiving at a respective control electrode a respective, "too late" stabilising input data, the number x being smaller than the number q.

BRIEF DESCRIPTION OF THE DRAWING

The invention and how it can be put into effect will be better understood from the following description which is given by way of non-limitative example with reference to the accompanying drawings, in which:

FIG. 1 shows a prior art domino-type MOS logic gate;

FIG. 2 illustrates the unwanted discharging phenomena of the output when one or a plurality of input data are tardily stabilized.

FIG. 3 shows a prior art multi-input domino-type AND-gate and

FIG. 4 shows a similar gate of the same type modified in accordance with the invention for the case in which a data $D_1$ stabilizes tardily, FIG. 5 showing the chronological sequence of the signals obtained;

DESCRIPTION OF THE PREFERRED EMBODIMENTS

Figure 6:
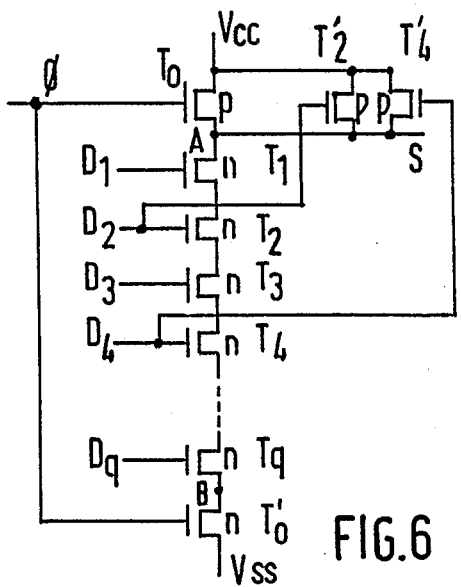
FIGS. 6 to 9 represent variations of a logic gate according to the invention.

A MOS logic gate of the known type, designated domino type, shown in FIG. 1, includes a first p-MOS precharging transistor $T_O$ whose drain is connected to a positive supply voltage source $V_{cc}$ and whose source is connected to a first logic terminal of a n-MOS logic network 1, and also a second n-MOS validation transistor $T'_O$ whose drain is connected to a second logic terminal B of the logic network 1 and whose source is connected to a negative supply voltage source $V_{ss}$. The logic network 1 receives at its inputs data $D_1 \ldots D_q$ which render the path AB conductive of non-conductive depending on the values of the data. The terminal A constitutes the output S of the logic gate.

The control electrodes of the transistors $T_O$ and $T'_O$ receive the clock signal $\phi$. When the signal $\phi$ is at its low level, the transistor $T_O$ is conductive and the transistor $T'_O$ is non-conductive, which results in the output S of the logic gate being at the high level, that is to say substantially $V_{cc}$ irrespective of whether the path AB1 is conductive or non-conductive. Put differently, the output S is precharged to the high level.

Because of its basic operating principle, this logic gate can only function correctly when the input data are stabilized before the clock signal $\phi$ is stabilized. Actually, if at least one of the data $D_1 \ldots D_q$, for example $D_3$, changes too slowly to the high or to the low state, see FIG. 2, the path AB can temporarily be in the conductive state and can discharge, completely or partly, the precharged level, whereas after stabilisation the path AB is nonconductive. This consequently results in a complete or partial loss of the precharge and the presence of a signal S may be faulty. In FIG. 2, a low level is obtained at the output whereas a high level should have been found.

FIGS. 3 to 5 illustrate how these faults can be obviated for the case of a multi-input AND-gate receiving the logic input signals $D_1 \ldots D_q$. Let it be assumed that the logic signal $D_3$ stabilizes tardily.

The prior art multiple AND-gate (FIG. 3) incorporates, arranged between the points A and B, the logic network 1 which is formed by q transistors of the n-MOS type $T_1 \ldots T_q$ whose drain-source paths are arranged in series and receive each one of the input data $D_1 \ldots D_q$ at their control electrodes.

A p-MOS type transistor $T'_3$ (FIG. 4) has its source-drain path connected in parallel with the sourcedrain path of the transistor $T_O$ and receives the logic signal $D_3$ at its control electrode. The chronological sequence of the signals is shown in FIG. 5. Let it be assumed that the input signals $D_1, D_2, D_3, \ldots D_q$ are at the high level rendering the path AB conductive and that only $D_3$ changes state from the high level to the low level. Since hypothetically $D_3$ is stabilized only after the clock signal $\phi$ has risen to the high level, the path AB remains conductive during a short instant t, while the transistor $T'_O$ is also conductive. This results in a partial or even complete loss of the precharge. The output signal S is then at a level $S_O$ quite near the low level. Once the data $D_3$ has been stabiized the transistor $T_3$ is cut-off, and the path AB is no longer conductive, while the transistor $T'_3$ is adjusted to the conductive state. As a result thereof, the output S returns to the high level, which corrects the output level.

It it is assumed that the data $D_3$ will afterwards change state to the high level, the transistor $T_3$ is rendered conductive and the transistor $T'_3$ is cut-off. The output S changes to the low level with a delay t because of the fact that the data $D_3$ changes to the high level after the clock signal $\phi$ has reached the high level. Consequently, the level at the output S is correct, but is only available after a delay.

In FIG. 6 it is assumed that the AND-gate of FIG. 3 has two tardily-stabilized input signals, namely $D_2$ and $D_4$. Compensating for the possible loss of the precharge is realised by arranging a sub-network of the p type logically complementary to the series arrangement of two transistors $T_2$ and $T_4$ in parallel with the transistor $T_O$. To this end, the source-drain path of a p-MOS transistor $T'_2$ and of a p-MOS transistor $T'_4$ are arranged in parallel with the source-drain path of transistor $T_O$, the control electrode of transistor $T'_2$ and the control electrode of transistor $T'_4$ receiving the input data $D_2$ and $D_4$ respectively. When the logic state of the AND-gate is such that a change from a high level to a low level of one of the two input data $D_2$ and $D_4$ is liable to render the path AB untimely conductive, which would result in a partial or complete loss of the precharge, either the one or the other of the transistors $T'_2$ and $T'_4$ or these two together permit a rise of the output S to the high level in conditions similar to those described with reference to the FIGS. 4 and 5.

Figure 7:
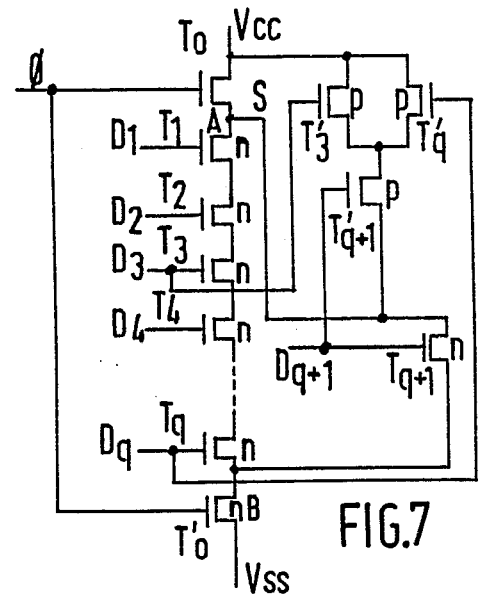

FIG. 7 corresponds to the logic function $(D_1.D_2.D_3 \ldots D_q)+D_{q+1}$. The logic gate includes for that purpose between the points A and B the series sub-network of n-MOS transistors $T_1, T_2, \ldots, T_q$ arranged in series as in FIG. 3, which at their control electrodes receive the respective input data $D_1, D_2, \ldots D_q$. The source-drain path of an n-MOS transistor $T_{q+1}$ whose control electrode receives the input data $D_{q+1}$ is connected in parallel with this series subnetwork. Let it be assumed that the input data $D_3$ and $D_q$ are slow in stabilizing. Taken in the direction from the supply terminal carrying a positive voltage $V_{cc}$, the parallel paths of the two p-MOS transistors $T'_3$ and $T'_q$ which at their control electrodes receive the respective input data $D_3$ and $D_q$ in series with a p-MOS transistor $T'_{q+1}$ which at its control electrode receives the input data $T_{q+1}$, are arranged, one after the other, in parallel with the source-drain path of the transistor $T_O$. When $D_{q+1}$ is at the low level, the transistor $T_{q+1}$ is in the nonconductive state and the transistor $T'_{q+1}$ is conductive, the circuit operates as in the case illustrated in FIG. 6. When, in contrast thereto, $D_{q+1}$ is at the high level, the transistor $T_{q+1}$ is conductive and the output S in the read mode is at the low level, while the transistor $T'_{q+1}$ is non-conductive and prevents any short-circuit between the supply voltages $V_{cc}$ and $V_{ss}$ independent of the fact whteher the transistors $T'_3$ and $T'_q$ are in the conductive or the non-conductive state, when the transistor $T'_O$ is conductive (O at the high level).

Figure 8:
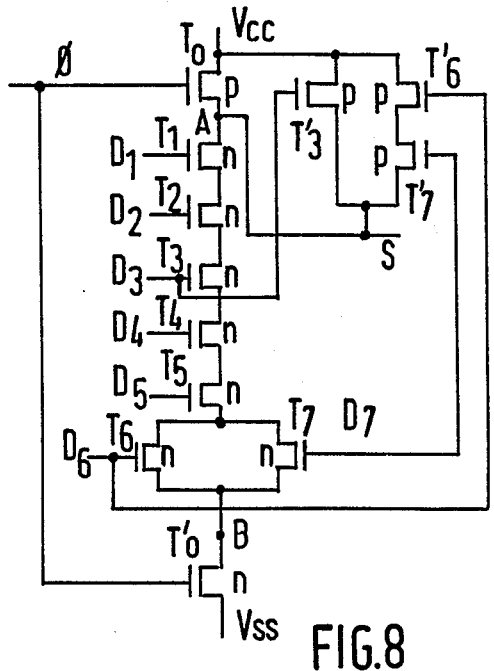

FIG. 8 illustrates the logic function $D_1.D_2.D_3.D_4.D_5.(D_6+D_7)$. Between the terminals A and B there is the series arrangement of the source-drain ppaths of five n-MOS transistors $T_1$ to $T_5$ which at their control electrodes receive the respective input data $D_1$ to $D_5$, these source-drain paths being arranged in series with the parallel-arranged source-drain paths of the two transistors $T_6$ and $T_7$.

Let it be assumed that the input data $D_3$ and $D_6$ are stabilizing too slowly. The complementary correction sub-network then has, parallel to the source-drain path of the transistor $T_O$, two parallel branches, one comprising the source-drain path of a p-MOS transistor $T'_3$ whose control electrode receives the input data $D_3$ and the other branch comprising the series-arranged source-drain paths of two p-MOS transistors $T'_6$ and $T'_7$ whose respective control electrodes receive the respective input data $D_6$ and $D_7$.

When the input data $D_7$ is at the low level, the transistor $T_7$ is non-conductive and the transistor $T'_7$ conducts. All this is similar to the case shown in FIG. 6 (q=6). When the input data $D_7$ is at the high level, the transistor $T_7$ is conductive and the transistor $T'_7$ is in the non-conductive state. Thus any risk of a short circuit between the positive and the negative supply voltages $V_{cc}$ and $V_{ss}$ is avoided.

Figure 9:
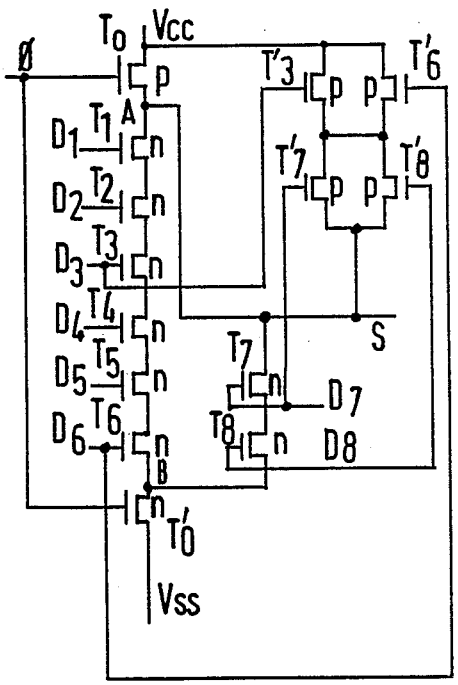

FIG. 9 illustrates the case of the logic function $(D_1.D_2.D_3.D_4.D_5.D_6)+(D_7.D_8)$.

To this end the logic gate has, between the terminals A and B, the parallel arrangement of two series-arranged branches. The first series branch comprises the source-drain paths of six n-MOS transistors $T_1$ to $T_6$ whose respective control electrodes receive the respective input data $D_1$ to $D_6$. The second series branch comprises the source-drain paths of two n-MOS transistors $T_7$ and $T_8$ whose respective control electrodes receive the respective input data $D_7$ and $D_8$. Let it be assumed that the data $D_3$ and $D_6$ are stabilized too slowly. The p-MOS type compensating sub-network which is arranged in parallel with the source-drain path of the transistor $T_O$ is the complementary network in p-MOS of the imaginary n-MOS imaginary sub-network formed by the transistors $T_3, T_6, T_7$ and $T_8$, the transistors $T_1, T_2, T_4$ and $T_5$ being left out of consideration. To that end, the p-MOS sub-network includes two groups of two p-MOS parallel-arranged transistors, these two groups being arranged in series. The first group comprises the source-drain path of the two transistors $T'_3$ and $T'_6$ whose control electrodes receive respectively the input data $D_3$ and $D_6$. Let it be assumed that the input data $D_3$ and $D_6$ stabilized too slowly. When the data $D_7$ and $D_8$ are not simultaneously in the high state, the second series branch is blocked and everything proceeds in the manner similar to the case illustrated in FIG. 6 (q=6).

When the data $D_7$ and $D_8$ are simultaneously in the high state, the second series branch is conductive, and the transistors $T'_7$ and $T'_8$ are cut-off, which prevents any possibility of a short-circuit between $V_{cc}$ and $V_{ss}$ when $T'_3$ and $T'_O$ are simultaneously in the conductive state.

What is claimed is:

1. A domino-type MOS logic gate including a logic network comprising an MOS validation transistor of a first conductivity type, an MOS precharging transistor of a second conductivity type, and MOS transistors of said first conductivity type for receiving input data and connected between a first and a second voltage source through the source-drain paths of said MOS precharging transistor and said MOS validation transistor, a control electrode of the precharging transistor and the validation transistor both receiving a clock signal which, when it is at a first logic level, precharges an output of the logic gate at a precharging level and when it is at a second logic level allows reading of a logic output signal at the output, characterized in that, in order to prevent an unwanted discharging of the precharging level in response to at least one input data being stabilized tardily, that is to say not before the clock signal has changed to said second logic level, said logic gate further comprises an MOS sub-network of the second conductivity type comprising the logic complement of at least one transistor of the logic network coupled in parallel with the source-drain path of said precharging transistor, said at least one transistor receiving said tardily stabilized input data, the sub-network receiving at least said tardily stabilized input data and the sub-network having fewer transistors than the logic network.

2. A logic MOS gate as claimed in claim 1, characterized in that the logic network includes an AND-gate having a number q of inputs and comprises a number q of transistors with their respective source-drain paths connected in series between the precharging transistor and the validation transistor, and the sub-network comprises a number x of transistors coupled in parallel with the precharging transistor, each of said x transistors receiving at its respective control electrode a respective tardily stabilizing input data, the number x being smaller than the number q.

3. A logic MOS gate as claimed in claim 1 or 2, characterized in that the first logic level is the low level, the second logic level is the high level, the first conductivity type is the n-channel type and the second conductivity type is the p-channel type.

* * * * *